3,107,188
Patented Oct. 15, 1963

3,107,188

PROCESS OF ETCHING SEMICONDUCTORS AND ETCHANT SOLUTIONS USED THEREFOR

Robert D. Hancock, Phoenix, Ariz., assignor to Pacific Semiconductors, Inc., Culver City, Calif., a corporation of Delaware No Drawing. Filed Nov. 21, 1960, Ser. No. 70,437
4 Claims. (Cl. 156—17)

This invention relates to the surface treatment of semiconductor materials and more particularly to a process for the etching of oxides from semiconductor bodies and to chemical solutions for such etching.

During various stages in the manufacture of certain types of semiconductor devices oxide coatings are formed on the surfaces of the semiconductor bodies. For example, in the production of diffused junction semiconductor devices oxide coatings are disposed over predetermined portions of the semiconductor body to act as a diffusant mask during a subsequent diffusion operation. In practice, the entire semiconductor body is oxide coated and then predetermined portions of the coating removed to expose the region of the underlying semiconductor material into which it is desired to diffuse an active impurity.

Oxides are commonly removed from semiconductor surfaces by an etching solution which will attack the oxide but will not attack the underlying elemental semiconductor material. The etching action is restricted to the desired surface area by protecting the remaining area with an etchant mask which is impervious to the etchant solution. Hydrofluoric acid is a commonly used etchant for the surface treatment of silicon and germanium semiconductor materials, and a wax coating is commonly used as an etchant mask. However, there are certain disadvantages associated with the commonly used etching solution and techniques. Many of the more effective etchant solutions stain the semiconductor surface. Also, when selectively etching surface portions of semiconductor bodies using a wax etchant mask the currently used etchant solutions tend to undercut the wax coating to various degrees so that clean and very sharply defined etched region boundaries are not obtained.

It is therefore an object of the present invention to provide an improved etch for the surfaces of semiconductor bodies.

It is also an object of the present invention to provide an improved etch for the surfaces of silicon semiconductor bodies.

It is a further object of the present invention to provide an improved etch to remove oxides from the surfaces of a semiconductor body.

It is another object of the present invention to provide an improved etch for the exposed surfaces of a semiconductor body partially coated with an etch resistant coating which improved etch causes very little undercutting of the coating.

It is a still further object of the present invention to provide an improved etch for the surfaces of silicon semiconductor bodies, which improved etch causes very little staining of the semiconductor surfaces.

The novel features which are believed to be characteristic of the invention, both as to its organization and method of operation, together with further objects and advantages thereof will be better understood from the following description in which a presently preferred embodiment of the invention is presented by way of example. It is to be expressly understood, however, that the description is for the purpose of illustration only and that the true spirit and scope of the invention is defined by the accompanying claims.

The improved etch of the present invention consists of an aqueous solution of hydrofluoric acid, phosphoric acid and ammonium bifluoride. The relative proportions and dilutions of the ingredients in the solution can be varied over a wide range while still providing the enumerated advantages. The solution has been found particularly effective for removing oxide from silicon surfaces, but is also suitable for removing oxide from the surfaces of other commonly used semiconductor materials, such as germanium. The solution causes very little undercutting of wax etchant masks and does not stain the semiconductor surfaces.

A presently preferred solution of the present invention can be conveniently prepared by mixing 100 grams of ammonium bifluoride with 100 ml. of ortho phosphoric acid (86% by weight) to form a slurry. The slurry is then added to 100 ml. of reagent grade hydrofluoric acid (48% by weight) and the resulting mixture agitated and allowed to stand at room temperature until equilibrium is attained; a period of about 12 hours being sufficient. In this preferred embodiment the relative proportions of ingredients are as follows:

| | Moles |
|---|---|
| Hydrogen fluoride | 2.9 |
| Water | 2.8 |
| Ortho phosphoric acid | 1.9 |
| Ammonium bifluoride | 1.8 |

The preceding solution will rapidly remove surface oxides from silicon semiconductor bodies, an etching time of approximately 30 seconds being sufficient to remove the thin oxide coatings commonly formed during the fabrication of diffused semiconductor devices. Although the same rapid etching together with the enumerated advantages is obtainable with other relative proportions of the respective ingredients, the illustrated solution is presently preferred. The removal of surface oxides can be accomplished with an etching time of no more than a few minutes with an etching solution having the relative proportions of ingredients within the following ranges:

| | Moles |
|---|---|
| Hydrogen fluoride | 1½–4 |
| Water | 1½–4 |
| Phosphoric acid | 1–3½ |
| Ammonium bifluoride | 1–3½ |

In applications where etching times are not critical the relative proportions of the ingredients can be varied over a much wider range. Since the etching effectiveness of hydrofluoric acid solutions are well known, one skilled in the art should be able to estimate permissible dilutions for a specific application.

Etchant masks commonly used with hydrofluoric etchants are suitable for use with the etchant of the present invention. These include apezion wax and photo resist materials.

Thus, there has been described an improved etchant for the removal of oxides from the surfaces of semiconductor bodies without surface staining and very little undercutting of an applied etchant mask. Although the invention has been described with a certain degree of particularity, various modifications of the proportions of the specified reagents may occur to those skilled in the art when considering certain specific applications of the etchant. Such modifications are considered within the spirit and scope of the present invention as defined by the following claims.

What is claimed is:

1. The process of removing oxides from a semiconductor surface which comprises the step of applying to said oxides an aqueous solution of hydrofluoric acid, phosphoric acid and ammonium bifluoride, said solution corresponding to a molar ratio within the range of from 1.5 to 4 moles hydrogen fluoride; 1.5 to 4 moles water; 1 to 3.5 moles phosphoric acid; and 1 to 3.5 moles ammonium bifluoride.

2. The process of removing oxides from a semiconductor surface which comprises the step of applying to said oxides an etching solution which corresponds to an approximate molar ratio of 2.9 moles hydrogen fluoride; 2.8 moles water; 1.9 moles ortho phosphoric acid; and 1.8 moles ammonium bifluoride.

3. An etchant for removing oxides from a semiconductor surface, said etchant consisting of an aqueous solution of hydrofluoric acid, phosphoric acid and ammonium bifluoride which corresponds to a molar ratio within the range of from 1.5 to 4 moles hydrogen fluoride; 1.5 to 4 moles water; 1 to 3.5 moles phosphoric acid; and 1 to 3.5 moles ammonium bifluoride.

4. An etchant for removing oxides from a semiconductor surface, said etchant consisting of an aqueous solution of hydrofluoric acid, ortho phosphoric acid and ammonium bifluoride which corresponds to an approximate molar ratio of 2.9 moles hydrogen fluoride; 2.8 moles water; 1.9 moles ortho phosphoric acid and 1.8 moles ammonium bifluoride.

References Cited in the file of this patent

UNITED STATES PATENTS

| | | |
|---|---|---|
| 2,376,219 | Winslow | May 15, 1945 |
| 2,411,298 | Shore | Nov. 19, 1946 |
| 2,419,237 | Treuting | Apr. 22, 1947 |
| 2,462,218 | Olsen | Feb. 22, 1949 |
| 2,593,449 | Hesch | Apr. 22, 1952 |
| 2,705,392 | Imler | Apr. 5, 1955 |
| 2,847,287 | Landgren | Aug. 12, 1958 |
| 2,876,144 | Bomberger et al. | Mar. 3, 1959 |